(12) United States Patent
Venkatesan et al.

(10) Patent No.: US 9,368,164 B2
(45) Date of Patent: Jun. 14, 2016

(54) DATA INDEPENDENT PERIODIC CALIBRATION USING PER-PIN VREF CORRECTION TECHNIQUE FOR SINGLE-ENDED SIGNALING

(71) Applicant: RAMBUS INC., Sunnyvale, CA (US)

(72) Inventors: Pravin Kumar Venkatesan, Santa Clara, CA (US); Kashinath Prabhu, Bangalore (IN); Makarand Shirasgaonkar, Pune (IN); Wayne Dettloff, Cary, NC (US)

(73) Assignee: Rambus Inc., Sunnyvale, CA (US)

( * ) Notice: Subject to any disclaimer, the term of this patent is extended or adjusted under 35 U.S.C. 154(b) by 124 days.

(21) Appl. No.: 14/086,818

(22) Filed: Nov. 21, 2013

(65) Prior Publication Data

US 2014/0149654 A1    May 29, 2014

Related U.S. Application Data

(60) Provisional application No. 61/730,020, filed on Nov. 26, 2012.

(51) Int. Cl.
| G11C 7/00 | (2006.01) |
| G11C 5/14 | (2006.01) |
| G11C 7/10 | (2006.01) |
| G11C 7/04 | (2006.01) |
| G11C 11/4099 | (2006.01) |
| G11C 29/02 | (2006.01) |
| G11C 29/04 | (2006.01) |

(52) U.S. Cl.
CPC ........ *G11C 5/147* (2013.01); *G11C 7/04* (2013.01); *G11C 7/1048* (2013.01); *G11C 7/1051* (2013.01); *G11C 7/1078* (2013.01); *G11C 11/4099* (2013.01); *G11C 29/021* (2013.01); *G11C 29/028* (2013.01); *G11C 2029/0409* (2013.01); *G11C 2207/2254* (2013.01)

(58) Field of Classification Search
CPC .. G11C 7/1051; G11C 7/1078; G11C 7/1048; G11C 7/04; G11C 5/04; G11C 5/147; G11C 29/021; G11C 11/4099
See application file for complete search history.

(56) References Cited

U.S. PATENT DOCUMENTS

| 7,236,894 | B2 | 6/2007 | Oh et al. | |
| 7,368,950 | B2 * | 5/2008 | Wu | G11C 5/147 326/68 |
| 7,496,777 | B2 * | 2/2009 | Kapil | G06F 1/3203 711/104 |
| 7,533,212 | B1 * | 5/2009 | Doblar | G06F 13/426 365/230.03 |
| 7,577,039 | B2 * | 8/2009 | Yang | G11C 5/04 365/189.05 |
| 7,619,938 | B2 * | 11/2009 | Co | G11C 5/04 365/185.22 |
| 7,642,105 | B2 * | 1/2010 | Co | G11C 29/06 257/E25.011 |
| 8,867,595 | B1 | 10/2014 | Luo et al. | |
| 2006/0245519 | A1 * | 11/2006 | Cheng | H04L 25/20 375/316 |
| 2010/0315719 | A1 * | 12/2010 | Saarikko | G02B 27/0081 359/630 |
| 2014/0149618 | A1 * | 5/2014 | Venkatesan | G06F 13/1668 710/110 |

* cited by examiner

*Primary Examiner* — Gene Auduong
(74) *Attorney, Agent, or Firm* — Lowenstein Sandler LLP

(57) ABSTRACT

A single-ended receiver includes an internal voltage generation circuit to set a first internal reference voltage (Vref). A model voltage generation circuit is configurable to receive an external reference voltage to be calibrated during an initial calibration. The model voltage generation circuit is configurable to track an offset value for voltage-temperature (VT) drift and the offset value is applied to the internal voltage generation circuit to calibrate the internal Vref during a periodic calibration of the single-ended receiver.

20 Claims, 9 Drawing Sheets

DATA INDEPENDENT PERIODIC CALIBRATION USING PER-PIN VREF CORRECTION TECHNIQUE FOR SINGLE-ENDED SIGNALING

RELATED APPLICATIONS

This application claims the benefit of U.S. Provisional Application No. 61/730,020, filed Nov. 26, 2012, the entire contents of which are incorporated by reference.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, including a load-reduced DIMM (LRDIMM) for Double Data Rate Type three (DDR3), which have been used for large-capacity servers and high-performance computing platforms. Memory capacity may be limited by the loading of the data query (DQ) bus and the request query (RQ) bus associated with the user of many DRAM devices and DIMMs. LRDIMMs may increase memory capacity by using a memory buffer (also referred to as a register). Registered memory modules have a register between the DRAM devices and the system's memory controller. For example, a fully buffered DIMM architecture introduces an advanced memory buffer (AMB) between the memory controller and the DRAMS devices on the DIMM. The memory controller communicates with the AMB as if the AMB were a memory device, and the AMB communicates with the DRAM devices as if the AMB were a memory controller. The AMB can buffer data, command and address signals. With this architecture, the memory controller does not write to the DRAM devices, rather the AMB writes to the DRAM devices. This architecture introduces latency to the memory request and increases power consumption for the AMB.

BRIEF DESCRIPTION OF THE DRAWINGS

The present embodiments are illustrated by way of example, and not of limitation, in the figures of the accompanying drawings in which.

DETAILED DESCRIPTION

In typical DRAM devices, a reference voltage (Vref) for the receivers (Rx) is external (sometimes referred to as external Vref). For low-input swing receivers, internal Vref per-pin can be used due to lower voltage margins. Initial and periodic calibration is needed to track and correct external common mode (CPHY), as well as internal voltage and temperature (VT) drift of the reference generation circuit for Vref. The embodiments described herein include receiver architecture for internal Vref calibration without explicit periodic Vref calibration and without utilizing the channel, such as a data channel (DQ channel) or request channel (RQ channel). The proposed embodiments can calibrate all error terms per pin to get optimal performance out of the low-swing preamplifier (preamp) with very low power.

Figure 1:
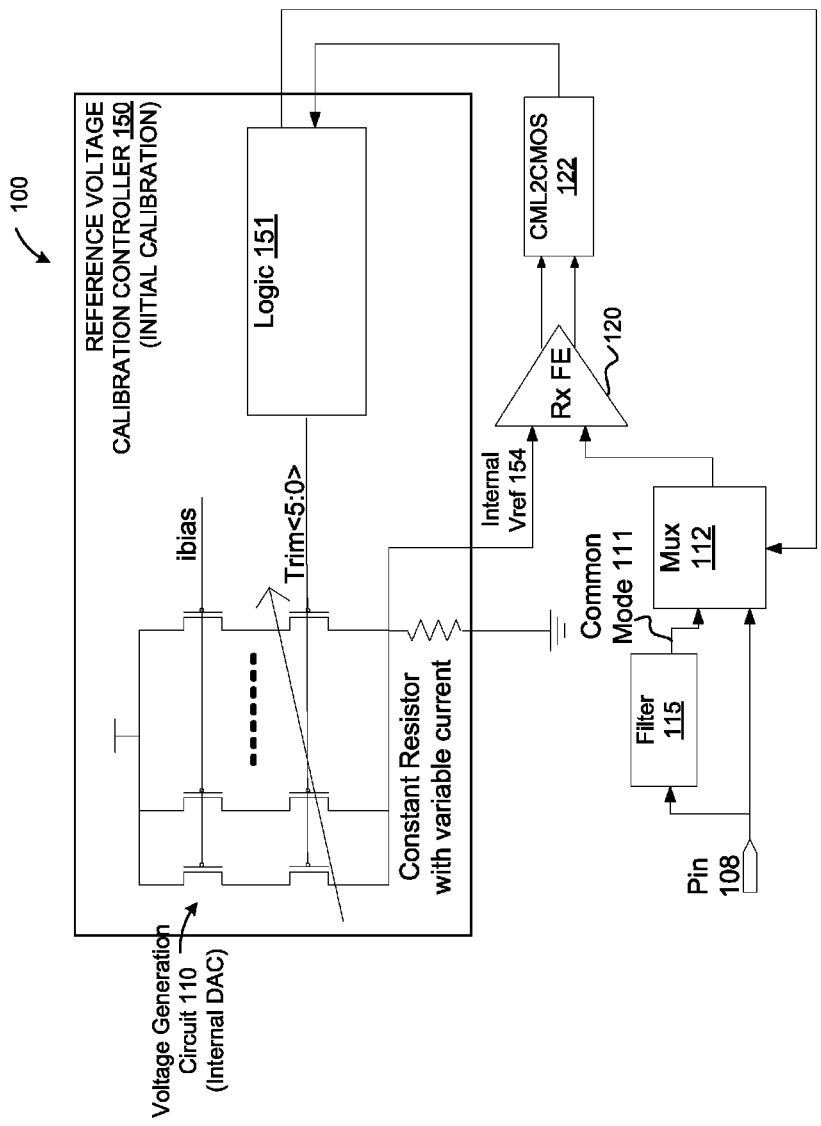
FIG. 1 is a block diagram illustrating receiver architecture for reference voltage (Vref) calibration according to one embodiment.

FIG. 1 is a block diagram illustrating receiver architecture 100 for reference voltage (Vref) calibration according to one embodiment. The receiver architecture 100 has a reference voltage calibration controller (Vref calibration controller) 150, a preamp 120, a filter 115, a multiplexer 112, and a common mode logic to CMOS logic (CML2CMOS) circuit 122. The Vref calibration controller 150 includes a voltage generation circuit 110 and logic 151. The receiver architecture 100 receives data on a pin 108. In one embodiment, the voltage generation circuit 110 is an internal Vref DAC (hereinafter also referred to as internal DAC) that generates an internal Vref 154. The logic 151, provides an offset to the voltage generation circuit 110, and the voltage generation circuit 110 generates the internal Vref 154 based on the offset. The preamp 120 receives the internal Vref 154 and the incoming signal on the pin 108 (filtered or unfiltered). The multiplexer 112 can be used to switch in the filter 115 during calibration. In particular, the preamp 120 can receive the incoming signal during normal operation and can receive the common mode 111 from the filter 115. Using, but not limited to, a clock pattern or any of the current balanced patterns at the input, an average can be calculated to get the common mode 111 using, but not limited to, one of the following options: 1) passive filters (e.g., RC filter); 2) switched capacitor filter; and 3) low bandwidth amplifier (e.g., voltage follower). The output of the preamp 120 is coupled to the CML2CMOS circuit 122 and the output of the CML2CMOS circuit 122 can be feedback to the logic 151. In another implementation, instead of the technique for generating the common mode as described above, a memory controller (CPHY) can transmit the common mode directly to the preamp 120, bypassing the filter 115 and the multiplexer 112.

In the depicted embodiment, the voltage generation circuit 110 includes six current sources (transistors) that are controlled by six switches, which are activated by trim signals (e.g., Trim<5:0>) received from the Vref calibration controller 150, and a resistor coupled to common ground. In other implementations, other number of current source transistors could be used. This voltage generation circuit 110 could be considered a constant resistor with variable current (as indicated by the arrow across the transistors). Also, in other implementations, other types of voltage generation circuits may be used as would be appreciated by one of ordinary skill in the art having the benefit of this disclosure. The voltage generation circuit 110 may be a circuit with constant current with variable resistance, a circuit with constant resistance with variable current, a circuit with a resistor divider with one being variable resistor, a circuit with active devices instead of resistors in any of the resistor combinations, or switched capacitance based adjustable voltage divider.

Figure 8:
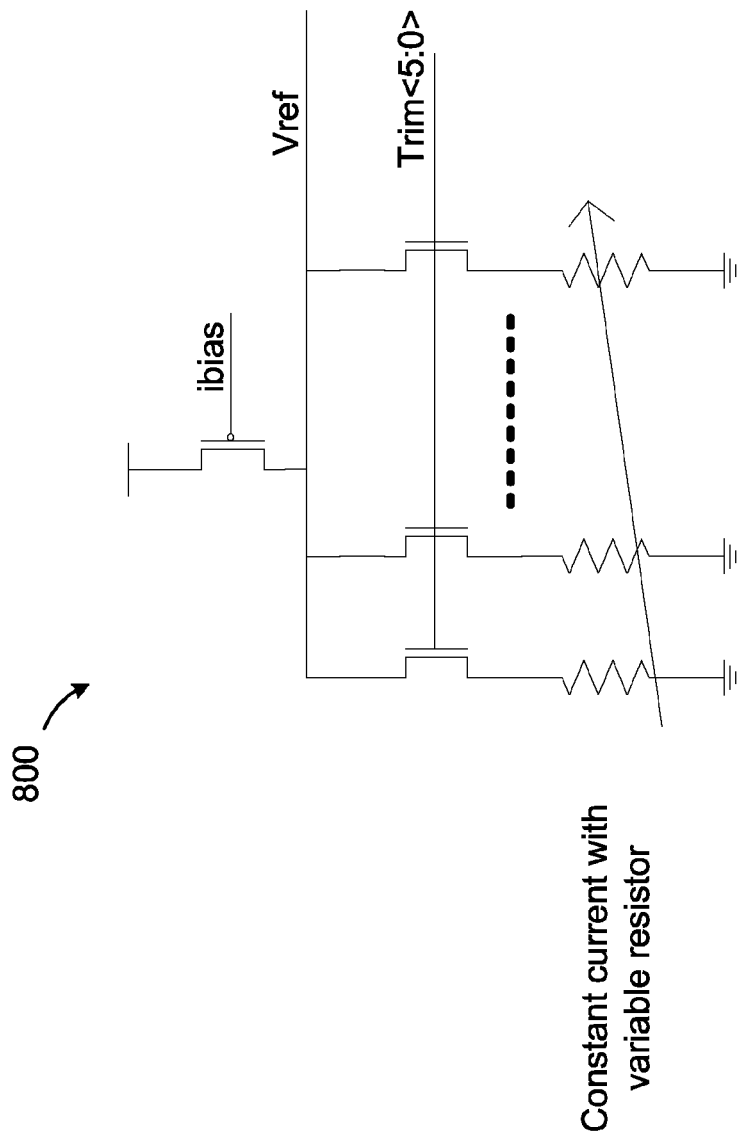
FIG. 8 is a diagram of a voltage generation circuit including a constant current and a variable resistance.
Figure 9:
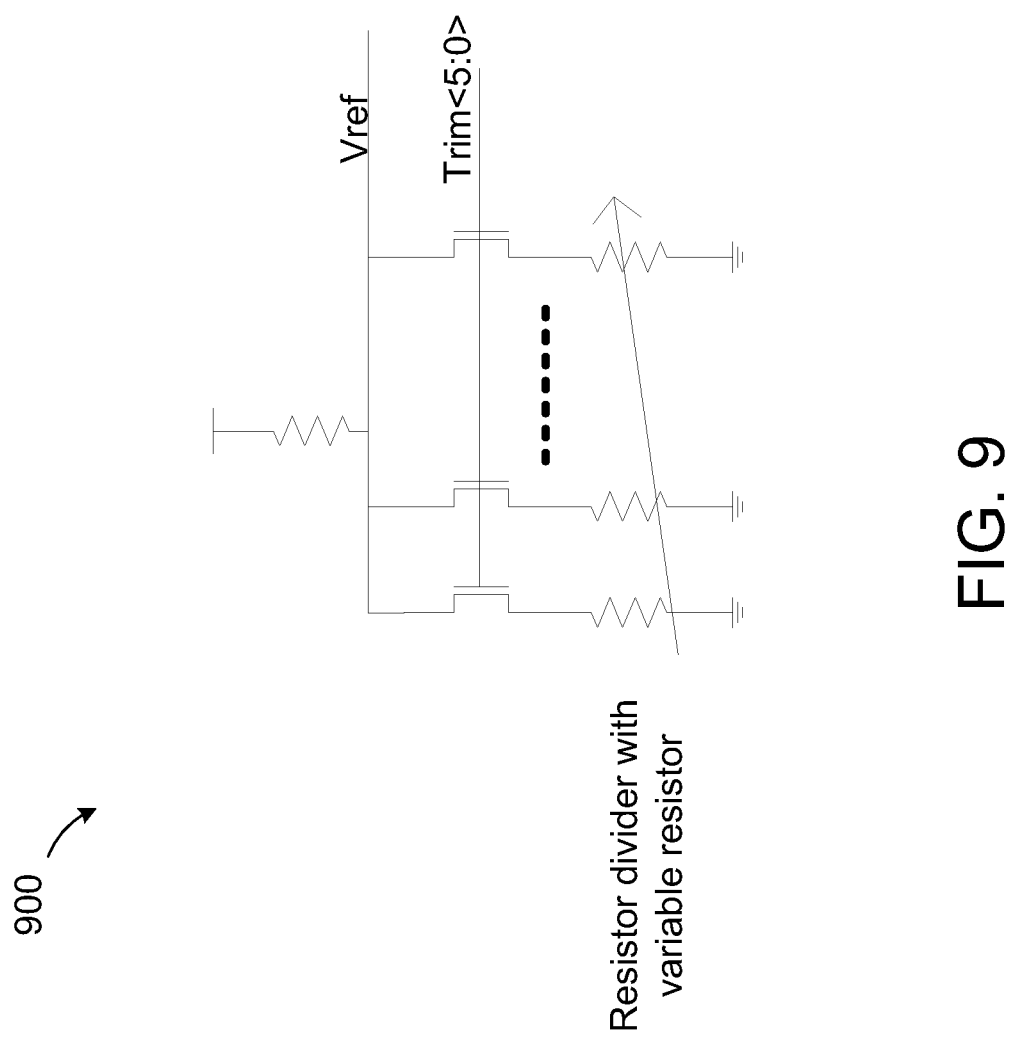
FIG. 9 is a diagram of a voltage generation circuit including a resistor divider and a variable resistance.

In one embodiment, as illustrated in FIG. 8, a voltage generation circuit 800 includes a constant current, as controlled by the trim signals from the Vref calibration controller, and a variable resistance (as indicated by the arrow across multiple resistors). In another embodiment, as illustrated in FIG. 9, a voltage generation circuit 900 includes a resistor divider, as controlled by the trim signals from the Vref calibration controller, and a variable resistance (as indicated by the arrow across multiple resistors). Furthermore, there are other variations for these voltage generation circuits 110, 800, and 900, including switching the top and bottom portions of the circuit, using PMOS or NMOS transistors, using active devices instead of passive resistors, or using any other voltage divider types as would be appreciated by one of ordinary skill in the art having the benefit of this disclosure.

As described above, initial and periodic calibration is needed to track and correct internal VT drift of the internal Vref 154 generated by the voltage generation circuit 110. Present voltage generation circuits 110, which are per-pin, each generate the internal Vref 154. However, VT drift in the voltage generation circuit 110 contributes to a large error as high as 15% of internal Vref value itself, which has to be periodically calibrated for low-swing inputs. For example, there is approximately 18 mV error in 125 mV Vref. The receiver preamp 120 may also need a higher input voltage (Vin) to take into account the error due to the untracked Vref error. For periodic calibration, normal data traffic on the DQ bus has to be stopped in order to allow a specific data pattern (also referred to as a clock pattern) to be sent from the transmitter (controller physical channel CPHY) to calibrate the internal Vref 154 per pin (per DQ Vref or per RQ Vref). This may result in a reduction in DQ bus utilization, as well as backward compatibility with standard LpDDRx or DDRx specifications.

More specifically in this implementation, a clock pattern is sent by the transmitter over the channel during each calibration. The filter 115 is used to extract the CPHY common mode per pin, and this signal is compared to the internal Vref 154 (generated using the voltage generation circuit 110) to calibrate the internal Vref 154. This architecture needs to wait until the common mode is generated in the filter 115 during periodic calibration. In one initial calibration process, the internal Vref is compared against a receive signal that includes a predetermined calibration pattern. A sampler samples the difference between the Vref and the received signal, and a calibration controller generates an error signal based on the sampler output and the predetermined calibration pattern. In one calibration step, the error signal is used to adjust the reference voltage so that the reference voltage is positioned substantially in the middle of the received signal.

In contrast, the implementations described below can be used to calibrate the internal Vref without the need for explicit periodic Vref calibration and without utilizing the DQ channel to get the optimal performance out of the low-swing preamp with very low power. The implementations described below provide a solution for data-independent, periodic Vref calibration that can be applied on a per-pin basis without reducing channel utilization and with less power than current calibration techniques. In one implementation, the Vref drift can be tracked per pin in a single-ended receiver without utilizing the channel. In this implementation, an initial action is performed to calibrate the receiver with an external Vref and transmitted data from a controller (as illustrated and described with respect to FIG. 1), and a subsequently, a model Vref DAC (or other voltage generation circuit) is calibrated during periodic calibration and the resulting offset of the model Vref DAC is applied to one or more internal DACs of one or more receives on a per-pin basis.

Figure 2:
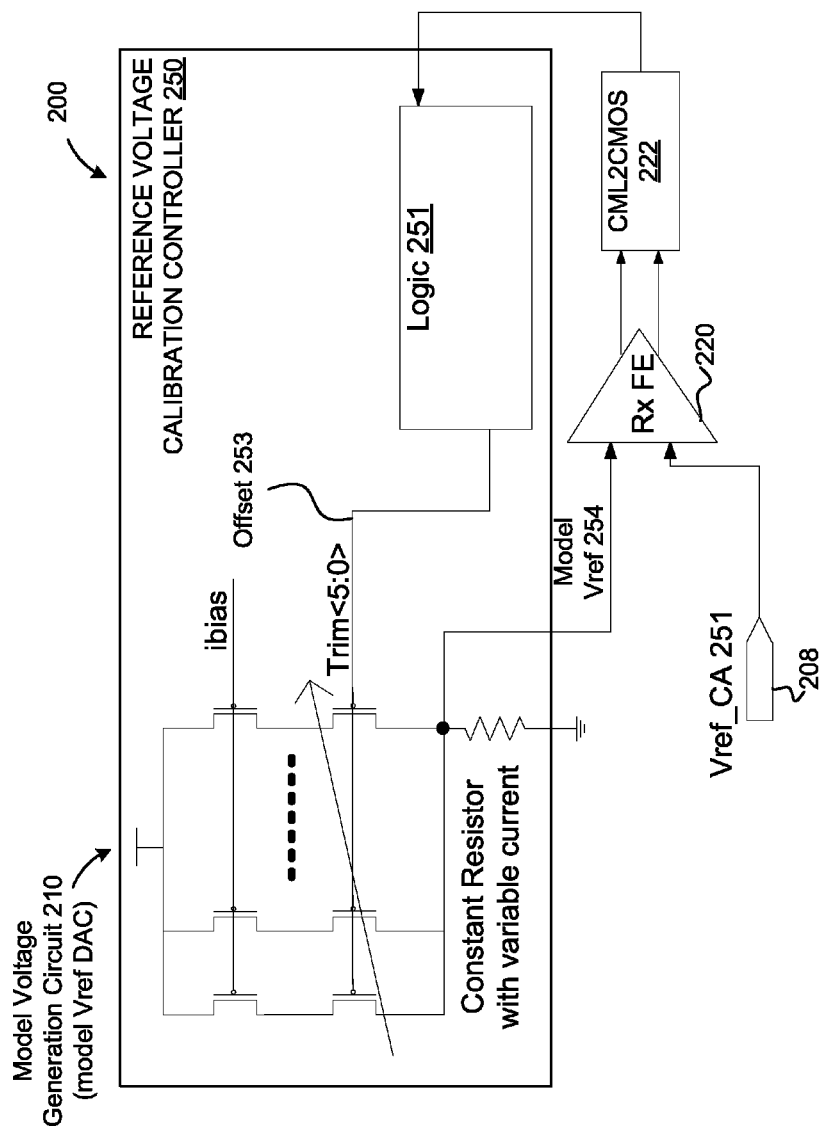
FIG. 2 is a block diagram illustrating receiver architecture with a model Vref digital-to-analog converter (DAC) for data-independent, periodic Vref calibration according to one embodiment.

FIG. 2 is a block diagram illustrating receiver architecture 200 with a model voltage generation circuit 210 for data-independent, periodic Vref calibration according to one embodiment. The receiver architecture 200 has a Vref calibration controller 250, a preamp 220 and a CML2CMOS circuit 222. The Vref calibration controller 250 includes a model voltage generation circuit 210 and logic 251. The model voltage generation circuit 210 generates a model Vref 254. In the depicted embodiment, the model voltage generation circuit 210 is a model Vref DAC that may be an internal copy of the internal DACs of the one or more receivers of the DQ bus or RQ bus. The model DAC may have similar characteristics as the internal DACs used for the receivers in the DQ bus or RQ bus. The logic 251 provides an offset 253 to the model DAC (e.g., voltage generation circuit 210), and the model DAC (e.g., the voltage generation circuit 210) generates the model Vref 254 based on the offset 253. The receiver architecture 200 receives an external Vref 251 on an external Vref pin 208. The logic 251 can also provide the offset 253 to other internal DACs of the receivers. As such, the other internal DACs can be based on the model DAC.

In this implementation, the voltage generation circuit 210 includes the constant resistor with variable current as illustrated in the voltage generation circuit 110 of FIG. 1. In other implementations, the voltage generation circuit 210 may include the other types of voltage generation circuits described with respect to FIGS. 1, 8 and 9.

The preamp 220 receives the model Vref 254 and the external Vref 251 on the pin 208. The output of the preamp 220 is coupled to the CML2CMOS circuit 222 and the output of the CML2CMOS circuit 222 can be feedback to the logic 251. Using the external Vref 251, the receiver architecture 200 can calibrate the model voltage generation circuit 210 to a specified voltage (e.g., 125 mV) at the common block during initial calibration. The initial calibration of the receivers (not illustrated in FIG. 2) may be done similar to the calibration technique illustrated and described with respect FIG. 1. The model voltage generation circuit 210 can be used to track VT drift by calibrating the model voltage generation circuit 210 to the external Vref 251 during periodic calibration. A difference in the error codes (also referred to as error terms) between the successive periodic calibrations (or between the initial calibration and the first periodic calibration) can be determined and can be applied to all the receivers to compensate for the internal VT drift (e.g., DAC error in the internal DACs). For example, the difference in error codes can be applied to all the CA pins of the one or more receivers. The periodic calibration can be hidden (performed during impedance calibration (ZCAL)) and can calibrate the delta variations due to the VT drift in the receiver.

The following table provides an example of an initial calibration of two receivers and error codes of three subsequent periodic calibrations (PCAL):

|  | Model Vref CAL | Receiver 1 | Receiver 2 |
|---|---|---|---|
| Init Cal | 32 | 28 | 45 |
| $1^{st}$ PCAL | 33 | Increase all offsets by 1 | Increase all offsets by 1 |
|  |  | 29 | 46 |
| $2^{nd}$ PCAL | 34 | Increase all offsets by 1 | Increase all offsets by 1 |
|  |  | 30 | 47 |
| $3^{rd}$ PCAL | 33 | Decrease all offsets by 1 | Decrease all offsets by 1 |
|  |  | 29 | 46 |

It should be noted that no separate offset calibration is needed in the periodic calibrations. The Vref calibration can handle offset of the preamp 220 as well.

The Vref calibration controller 250, with the model voltage generation circuit 210, can provide a periodic calibration scheme without the need for external data pattern for Vref calibration. This periodic calibration scheme does not stop the DQ bus (or RQ bus) for the external data pattern, and thus, can be performed transparently and can be done in DRAMs without extra time for calibration as it may be done during ZCAL.

In one embodiment, the receiver architecture 200 can be used for tracking the VT drift without the need of the source (transmitter) sending a pattern to periodically calibrate the receivers. This internal reference can be customized to each of the receivers, which results in minimum internal error.

In one implementation, a device, including a single-ended receiver, receives an external Vref 251 on a first pin. The single-ended receiver is used for receiving data from a single-ended transmitter via a channel. The single-ended receiver includes a first voltage generation circuit (e.g., first internal DAC) to set a first internal Vref generated by the first voltage generation circuit. During an initial calibration of the single-ended receiver, the model voltage generation circuit 210 (e.g., a copy of the voltage generation circuit) is calibrated using the external Vref. The model voltage generation circuit 210 is to set a model reference voltage 254. An offset value 253 for the voltage-temperature (VT) drift in the model reference voltage 254 is tracked by the Vref calibration controller 250. The Vref calibration controller 250 applies the offset value 253 to the voltage generation circuit (e.g., internal DAC) to calibrate the first internal Vref during a periodic calibration of the single-ended receiver. The same offset value can be applied to other receivers. For example, during the periodic calibration, the Vref calibration controller 250 applies the offset value 253 to a second voltage generation circuit (e.g., a second internal DAC) to calibrate a second internal Vref generated by the second voltage generation circuit, such as illustrated in FIG. 3.

Figure 3:
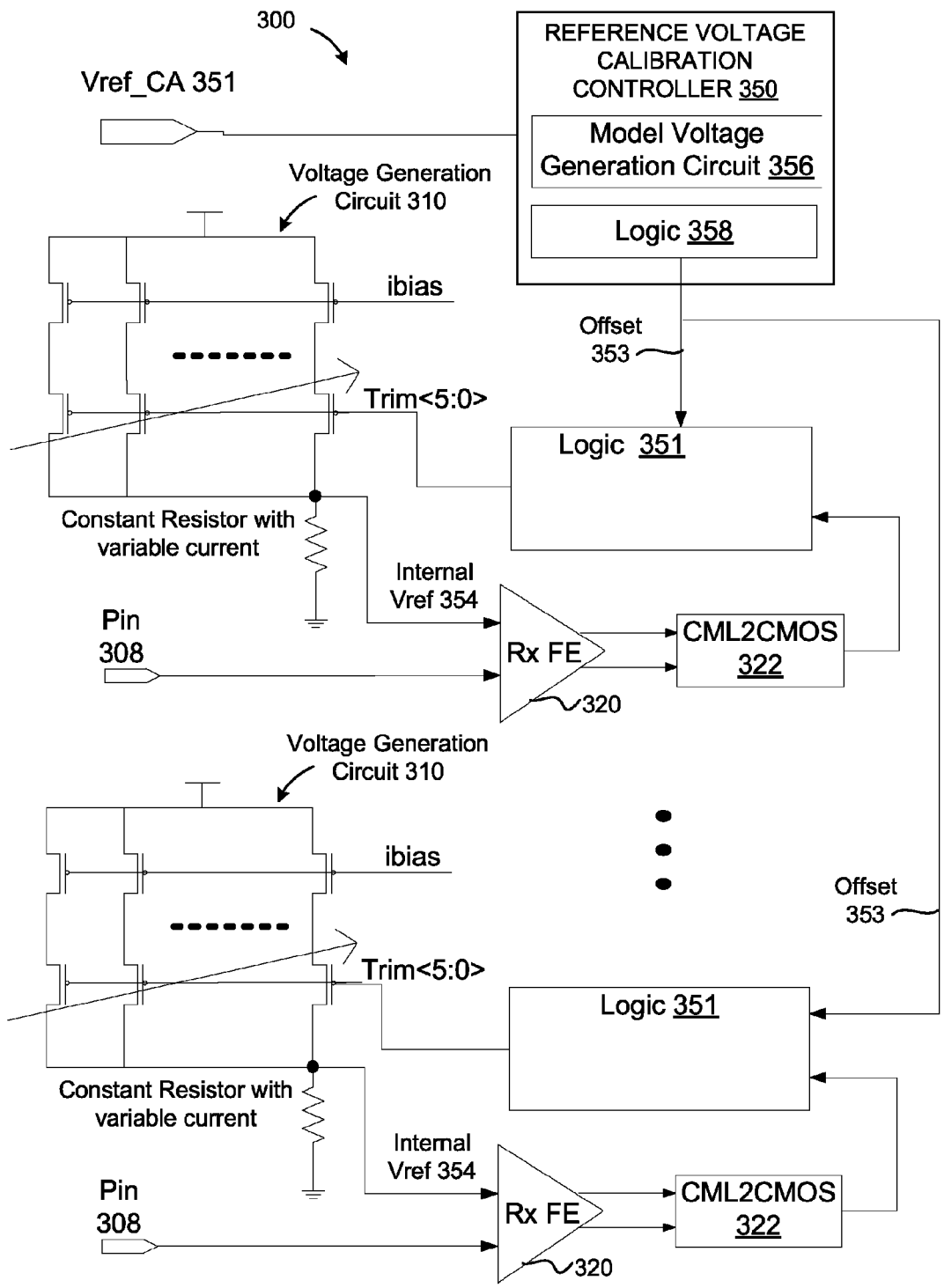
FIG. 3 is a block diagram illustrating receiver architecture with a model voltage generation circuit for periodic Vref calibration of multiple receivers according to another embodiment.

FIG. 3 is a block diagram illustrating receiver architecture 300 with a model voltage generation circuit 356 for periodic Vref calibration of multiple receivers according to another embodiment. The receiver architecture 300 includes a Vref calibration controller 350 that receives an external Vref 351 to calibrate a model voltage generation circuit 356 (E.g., model DAC). Logic 358 generates an offset 353 as described above with respect to FIG. 2 to calibrate the model voltage generation circuit 356. The logic 358 of the Vref calibration controller 350 applies the offset 353 to each of the receivers. For example, the Vref calibration controller 350 applies the offset 353 to each of the receivers, where each receiver includes a voltage generation circuit 310 (e.g., internal DAC), logic 351, preamps 320, and CML2CMOS 322. In particular, the model voltage generation circuit 310 can be set by the offset 353 calculated by the Vref calibration controller 350. For example, the corresponding trim signals used to set the model Vref voltage can be applied to the voltage generation circuit 310 in each of the receivers to set the internal Vref 354. The preamp 320 receives the internal Vref 354 and the data signal on the pin 308. The output of the preamp 320 is received at the CML2CMOS 322 and the output of the CML2CMOS 322 can be fed back to the logic 351.

In this implementation, the voltage generation circuits 310 includes the constant resistor with variable current as illustrated in the voltage generation circuit 110 of FIG. 1. In other implementations, the voltage generation circuits 310 may include the other types of voltage generation circuits described with respect to FIGS. 1, 8 and 9.

As described above, the internal Vref 354 can be initially calibrated using the techniques described above with respect to FIG. 1, such as using a clock pattern received on the pin 308 via the channel. In one implementation, the internal Vref 354 are calibrated initially by receiving the clock pattern on the pin 308 coupled to the channel, filtering the clock pattern, and comparing the filtered clock pattern to the internal Vref 354 to set the internal Vref 354. After initial calibration and during periodic calibration, the internal Vref 354 is calibrated without using the channel by using the offset that is tracked by the model voltage generation circuit 356. In one implementation, the offset is tracked by the Vref calibration controller 350 by determining a first difference between a first error code of the model DAC (e.g., 356) determined during initial calibration and a second error code of the model DAC determined during the periodic calibration. The Vref calibration controller 350 applies the first difference to the internal DAC (e.g., 310) to calibrate the internal Vref 354 during the periodic calibration. In a further implementation, the Vref calibration controller 350 applies the first difference to a second internal DAC (e.g., 310) to calibrate a second internal Vref 354 generated by the second voltage generation circuit 310.

The Vref calibration controller 350 can repeat this for subsequent periodic calibrations. In one implementation, the Vref calibration controller 350 determines a second difference between the second error code determined during the periodic calibration and a third error code of the model DAC (e.g., 356) determined during a subsequent periodic calibration. The Vref calibration controller 350 applies the second difference to the internal DAC (e.g., 310) to calibrate the internal Vref 354 during the subsequent periodic calibration. In a further implementation, the Vref calibration controller 350 applies the second difference to the second internal DAC (e.g., 310) to calibrate the second internal Vref 354 by the second voltage generation circuit 310.

It should be understood that the Vref calibration controllers of FIGS. 1-3 include DACs for the voltage generation circuits. In other implementations, other voltage generation circuits than DACs can be used to generate the model Vref and the internal Vrefs as described herein.

Figure 4:
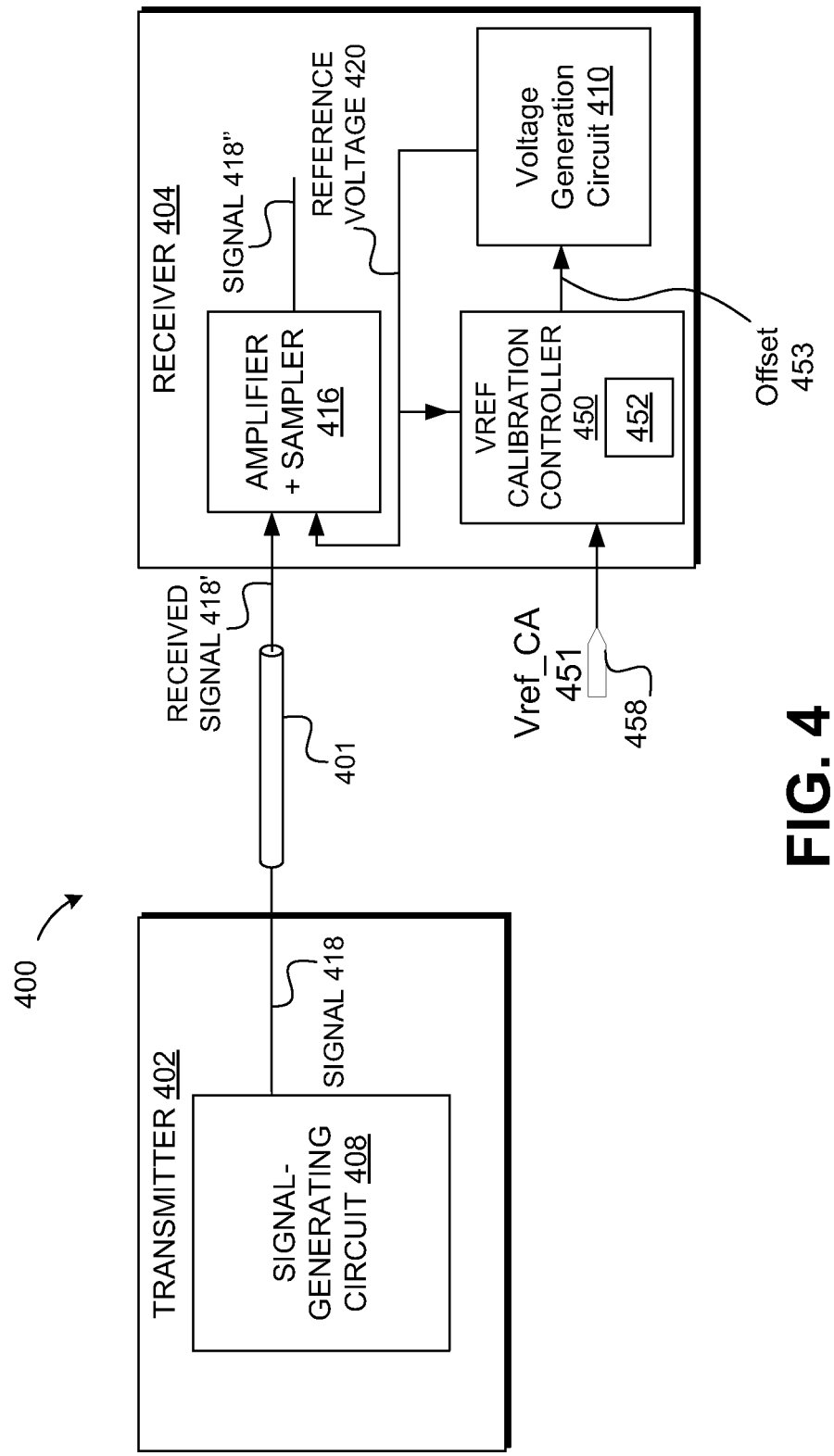
FIG. 4 is a high-level block diagram illustrating a single-ended communication system that uses a transmitter and a receiver with a model voltage generation circuit for data-independent, periodic Vref calibration according to another embodiment.

FIG. 4 is a high-level block diagram illustrating a single-ended communication system 400 that uses a transmitter 402 and a receiver 404 with a model voltage generation circuit 452 for data-independent, periodic Vref calibration according to another embodiment. As illustrated in FIG. 4, communication system 400 includes a transmitter 402 (such as a memory controller), a receiver 404 (such as a memory device), and an interface 401 coupled between transmitter 402 and receiver 404. The interface 101 includes a signal channel. The transmitter 402 can further include a signal-generating circuit 408, while receiver 404 can further include an amplifier/sampler 416, a Vref calibration controller 450 and a voltage generation circuit 410.

During data signal on communication system 400, signal-generating circuit 408 in transmitter 402 generates a signal 418, which is then transmitted over the signal channel. Signal 418 is received by the receiver 404 as received signal 418'. In particular implementations, signal 418 (and hence signal 418') is a single-ended voltage signal, which is referenced to a ground level. For example, this ground level can be a ground node of a power supply, Vss. To recover the original signal 418 on receiver 404, signal 418' is compared against a reference voltage 420 generated by the voltage generation circuit 410, and the difference between the two signals is sampled by amplifier/sampler 416. The voltage generation circuit 410 may be any of the voltage generation circuits described herein. In some implementations, both signal 418' and reference voltage 420 are referenced to a ground node of a power supply, Vss'. Ideally, amplifier/sampler 416 outputs signal 418'', which is a copy of signal 418. Of course, the actual signal 418'' may be affected by noise. The receiver 404 may include other circuits to compensate for the noise level. The receiver 404 further includes circuitries for initializing and calibrating the amplifier/sampler 415, such as the Vref calibration controller 450. Moreover, although only a single signal 418 is shown being transmitted from transmitter 404 to receiver 404, in many cases there may be multiple signals transmitted from transmitter 402 to receiver 404, and communication system 400 may have multiple amplifiers/samplers for handing such multiple signals. Additional, one or more signals may be transmitted from receiver 104 to transmitter 102. Also, the transmitter 402 can send the signal 418 to more than one or receivers.

Transmitter 402 and receiver 404 may be located on the same integrated circuit, or they can be located on different integrated circuits. In other implementations, transmitter 402 and receiver 404 may be located on separate modules (e.g., separate cards) coupled by one or more buses.

Note that signal 418 may be a digital or analog signal, or any general signal capable of communicating information. In some implementations, signal 418 is a digital signal associated with memory operations. In these implementations, signal 418 can include read/write data, a control signal, an address signal and a clock signal. In specific implementations, this digital signal is a binary signal comprising 1's and 0's.

The Vref calibration controller 450 may be any of the Vref calibration controllers as described herein. The Vref calibration controller 450 receives an external Vref 451, such as on a pin 458. The Vref calibration controller 450 tracks the offset 453 using the model voltage generation circuit 452, and applies the offset 453 to the voltage generation circuit 410, which generates the reference voltage 420. The reference voltage 420 may also be fed back to the Vref calibration controller 450.

In one implementation, the voltage generation circuits 410 includes a constant resistor with variable current as illustrated in the voltage generation circuit 110 of FIG. 1. In other implementations, the voltage generation circuits 410 may include the other types of voltage generation circuits described with respect to FIGS. 1, 8 and 9. Similarly, the model voltage generation circuit 452 may include a constant resistor with variable current as illustrated in the voltage generation circuit 110 of FIG. 1 or the other types of voltage generation circuits described with respect to FIGS. 1, 8 and 9.

Figure 5:
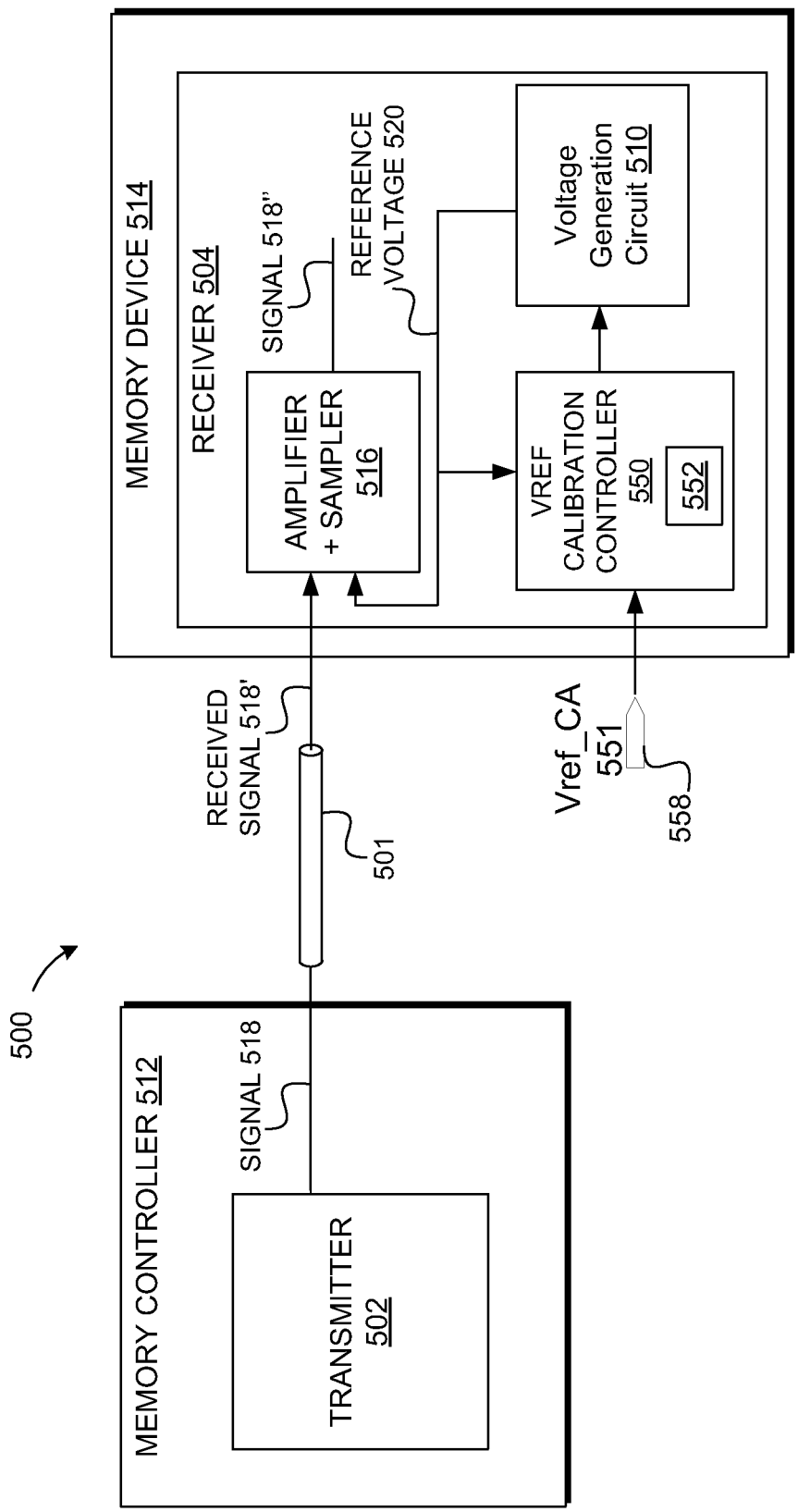
FIG. 5 is a high-level block diagram illustrating a single-ended memory system including a memory controller and a DRAM device with a model voltage generation circuit for data-independent, periodic Vref calibration according to another embodiment.

FIG. 5 is a high-level block diagram illustrating a single-ended memory system 500 including a memory controller 512 and a DRAM device 514 with a model voltage generation circuit 552 for data-independent, periodic Vref calibration according to another embodiment. The memory system 500 includes a memory controller 512 including transmitter 502, a memory device 514 including receiver 504. In some implementations, memory device 504 is a DRAM device. However, memory device 504 can include other types of memory devices. The transmitter 502 and receiver 504 are similar to the transmitter 402 and receiver 404 described with respect to FIG. 4. The transmitter 502 sends a signal 518 over the signal channel of the interface 501, and the receiver 504 receives the signal as the received signal 518'. The receiver 504 includes the amplifier/sampler 516, the reference voltage generation circuit 510 and the Vref calibration controller 550 that includes the model voltage generation circuit 552. These components are similar to those described with respect to FIG. 4. In particular, the Vref calibration controller 550 receives the external Vref 551 on pin 558, and tracks the VT drift in the reference voltage 520 using the model voltage generation circuit 552. In particular, the Vref calibration controller 550 generates the offset value and applies the offset value to the voltage generation circuit 510, which generates the reference voltage 520. The amplifier/sampler 516 receives the received signal 518' and compares it against the reference voltage 520 generated by the voltage generation circuit 510. The amplifier/sampler 516 outputs the signal 518''.

In one implementation, the voltage generation circuits 510 includes a constant resistor with variable current as illustrated in the voltage generation circuit 110 of FIG. 1. In other implementations, the voltage generation circuits 510 may include the other types of voltage generation circuits described with respect to FIGS. 1, 8 and 9. Similarly, the model voltage generation circuit 552 may include a constant resistor with variable current as illustrated in the voltage generation circuit 110 of FIG. 1 or the other types of voltage generation circuits described with respect to FIGS. 1, 8 and 9.

In one implementation, the transmitter 502 is on a first integrated circuit and the receiver 504 is on a second integrated circuit. The first integrated circuit may include a host computer (e.g., CPU having one more processing cores, L1 caches, L2 caches, or the like), a host controller, or other types of processing devices. The second integrated circuit may include a memory device coupled to the host device, and whose primary functionality is dependent upon the host device, and can therefore be considered as expanding the host device's capabilities, while not forming part of the host device's core architecture. The memory device may be capable of communicating with the host device via a DQ bus and a CA bus. For example, the memory device may be a single chip or a multi-chip module including any combination of single chip devices on a common integrated circuit substrate. The components of FIG. 5 can reside on "a common carrier substrate," such as, for example, an integrated circuit ("IC") die substrate, a multi-chip module substrate, or the like. Alternatively, the memory device may reside on one or more printed circuit boards, such as, for example, a mother board, a daughter board or other type of circuit card. In other implementations, the main memory and processor can reside on the same or different carrier substrates.

Figure 6:
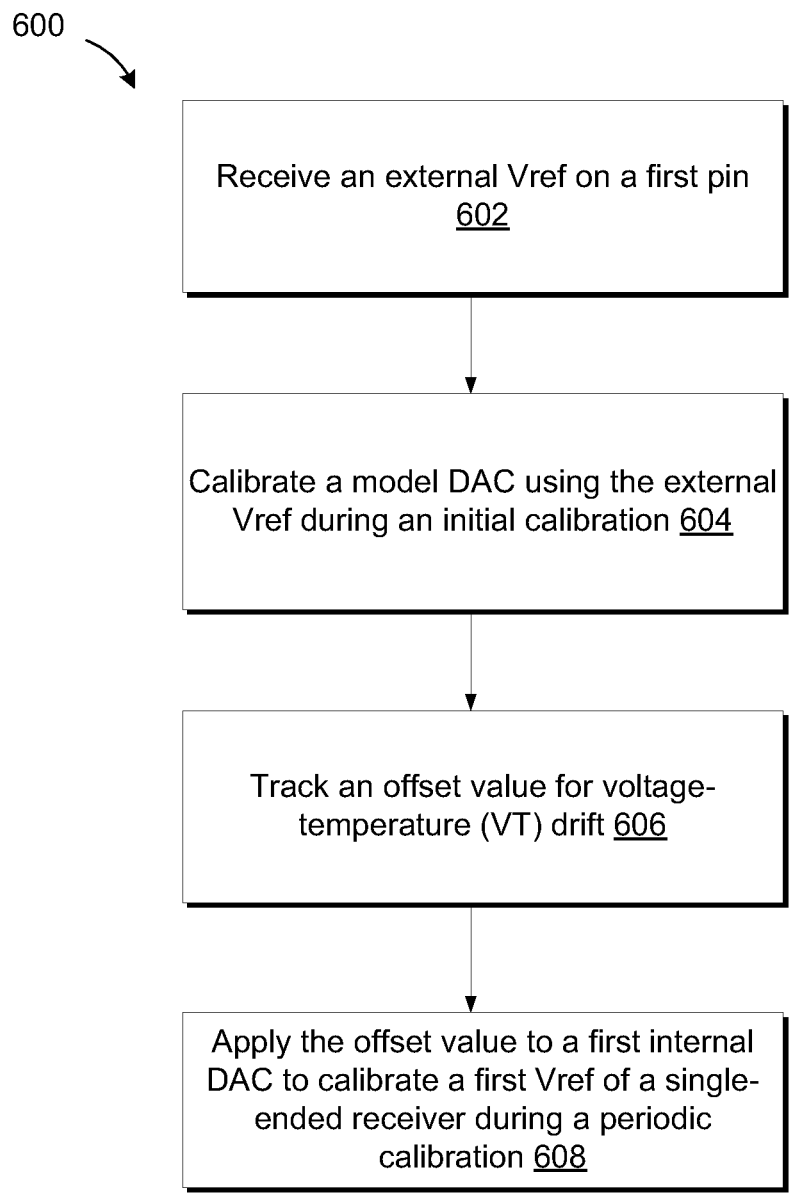
FIG. 6 is a flow diagram of a method of operating a receiver with a model voltage generation circuit for data-independent, periodic Vref calibration according to an embodiment.

FIG. 6 is a flow diagram of a method 600 of operating a receiver with a model voltage generation circuit for data-independent, periodic Vref calibration according to an embodiment. The method 600 begins with receiving an external Vref on a first pin at the Vref calibration controller (block 602), as described herein. The Vref calibration controller calibrates a model DAC using the external Vref during an initial calibration of the receiver (block 604). The Vref calibration controller tracks an offset value for the voltage-temperature (VT) drift of a model Vref (block 606). The Vref calibration controller applies the offset value to a first internal DAC to calibrate a first Vref of the receiver during a periodic calibration (block 608).

In a further implementation, the Vref calibration controller applies the offset value to a second internal DAC to calibrate a second internal Vref generated by a second voltage generation circuit during the periodic calibration. The Vref calibration controller calibrates the first internal DAC during the initial calibration using a clock pattern on a second pin via the channel. For example, the clock pattern can be received on the second pin, filtered and compared to the first internal Vref to set the first internal Vref.

In another implementation, the Vref calibration controller tracks the offset and applies the offset by determining a first difference between a first error code of the model DAC determined during initial calibration and a second error code of the model DAC determined during the periodic calibration. The Vref calibration controller applies the first difference to the first internal DAC to calibrate the first internal Vref during the periodic calibration. The Vref calibration controller can repeat for subsequent periodic calibrations. For example, the Vref calibration controller determines a second difference between the second error code determined during the periodic calibration and a third error code of the model DAC determined during a subsequent periodic calibration, and applies the second difference to the first internal DAC to calibrate the first internal Vref during the subsequent periodic calibration. The second difference can also be applied to a second internal DAC to calibrate a second internal Vref during the subsequent periodic calibration.

In another implementation of a method, the method beings by performing an initial calibration of a reference voltage (Vref) generated by a voltage generation circuit in a single-ended receiver. The initial calibration includes calibrating the Vref using an external Vref from an external Vref pin and data received from a single-ended transmitter on a data channel (DQ channel). The method performs a periodic calibration of the Vref without using additional data on the data channel by calibrating a model DAC using the external Vref and applying an offset of the model DAC to the single-ended receiver to calibrate the Vref.

In one implementation, the initial calibration includes receiving a clock pattern as the data received from the single-ended transmitter on the data channel. The clock pattern is filtered and compared to the Vref generated by the voltage generation circuit to calibrate the Vref during the initial calibration. The clock pattern can be filtered using a passive filter (RC filter), a switched capacitor filter, a low bandwidth amplifier such as a voltage follower, or the like.

In one implementation, the periodic calibration includes determining a first difference between a first error code of the model DAC determined during the performing the initial calibration and a second error code of the model DAC determined during the performing the periodic calibration, and applying the first difference to a first internal DAC of the voltage generation circuit to calibrate the Vref during the periodic calibration. The method may further include determining a second difference between the second error code determined during the performing the periodic calibration and a third error code of the model DAC determined during a subsequent periodic calibration and applying the second difference to the first internal DAC to calibrate the Vref during the subsequent calibration. As described herein, the offset, the first difference, the second difference can be applied to multiple single-ended receivers.

The single-ended receiver may be a DRAM and the single-ended transmitter may be a memory controller. Alternatively, the single-ended receiver is a memory controller and the single-ended transmitter is a DRAM device. Alternatively, other memory devices may be used as would be appreciated by one of ordinary skill in the art having the benefit of this disclosure.

For simplicity of explanation, the methods are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

Figure 7:
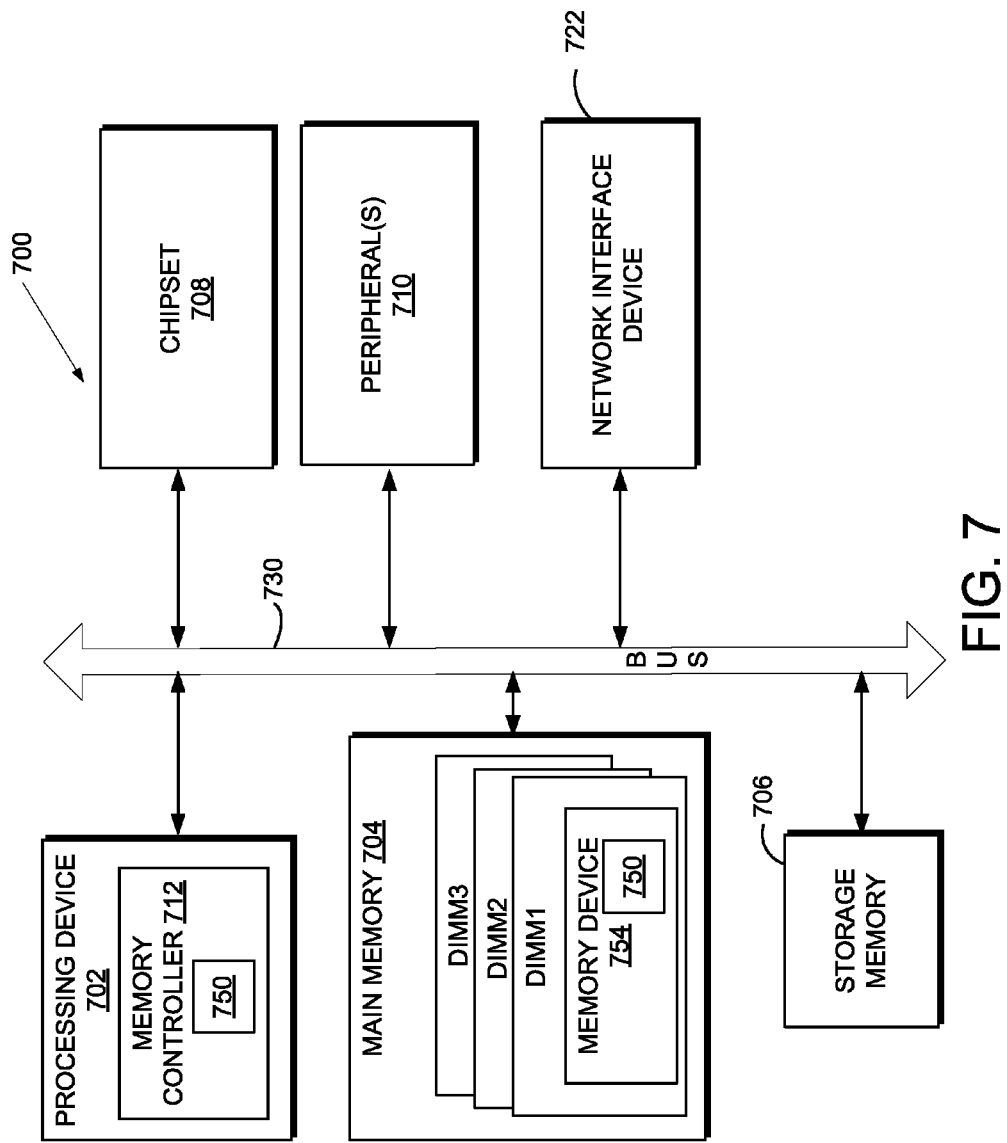
FIG. 7 is a diagram of a computer system, including main memory with a model voltage generation circuit for data-independent, periodic Vref calibration according to one embodiment.

FIG. 7 is a diagram of a computer system 700, including main memory 700 with a model voltage generation circuit for data-independent, periodic Vref calibration according to one embodiment. The computer system 700 may be connected (e.g., networked) to other machines in a LAN, an intranet, an extranet, or the Internet. The computer system 700 can be a host in a cloud, a cloud provider system, a cloud controller, a server, a client, or any other machine. The computer system 700 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 700 includes a processing device 702 (e.g., host processor 150 or processing device 110 of FIG. 1), a main memory 704 (e.g., read-only memory (ROM), flash memory, dynamic random access memory (DRAM), a storage memory 706 (e.g., flash memory, static random access memory (SRAM), etc.), and a secondary memory 718 (e.g., a data storage device in the form of a drive unit, which may include fixed or removable computer-readable storage medium), which communicate with each other via a bus 730. The main memory 704 includes the receiver architectures 750 as described above with respect to FIGS. 1-5, as described in more detail below.

Processing device 702 represents one or more general-purpose processing devices such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. Processing device 702 includes a memory controller 712 as described above. The memory controller 712 is a digital circuit that manages the flow of data going to and from the main memory 704. The memory controller 712 can be a separate integrated circuit, but can also be implemented on the die of a microprocessor. The memory controller 712 includes the receiver architectures 750 as described above with respect to FIGS. 1-5 as described above.

In one implementation, the memory architectures 750 includes a single-ended receiver, which includes a first voltage generation circuit to generate a first internal Vref, a first internal DAC to set the first internal Vref, an amplifier to receive the first internal Vref and a data signal on a data channel from a single-ended transmitter, and a reference voltage calibration controller. The reference voltage calibration controller includes a model DAC that is configurable to set a model reference voltage. The reference voltage calibration controller is configurable to calibrate the model DAC using an external Vref during an initial calibration of the single-ended receiver, and track an offset value for the VT drift in the model reference voltage using the model DAC. The reference voltage calibration controller is configurable to apply the offset value to the first internal DAC to calibrate the first internal Vref during a periodic calibration of the single-ended receiver. In a further implementation, the single-ended receiver includes a filter coupled to a pin to receive a data signal received from a single-ended transmitter via a channel, a multiplexer coupled to the filter and to the pin and logic circuitry coupled to the output of the amplifier. The logic circuitry is configurable to calibrate the single-ended receiver in the initial calibration using the external Vref and a signal pattern received on the pin via the channel and to calibrate the single-ended receiver in the periodic calibration using the external Vref and the model DAC. The signal pattern is not received on the pin during the periodic calibration. In a further implementation, the reference voltage calibration controller is configurable to apply the offset value to a second internal DAC to calibrate a second internal Vref generated by a second voltage generation circuit of a second single-ended receiver. As described herein, the single-ended receiver resides in the memory device 754 or in the memory controller 712.

The computer system 700 may include a chipset 708, which refers to a group of integrated circuits, or chips, that are designed to work with the processing device 702 and controls communications between the processing device 702 and external devices. For example, the chipset 708 may be a set of chips on a motherboard that links the processing device 702 to very high-speed devices, such as main memory 704 and graphic controllers, as well as linking the processing device to lower-speed peripheral buses of peripherals 710, such as USB, PCI or ISA buses.

The computer system 700 may further include a network interface device 722. The computer system 700 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device (e.g., a speaker).

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigurable by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   receiving an external reference voltage (Vref) on a first pin of a device comprising a single-ended receiver coupled to receive a data signal from a single-ended transmitter via a channel, wherein the single-ended receiver comprises a first voltage generation circuit to set a first internal Vref;
   calibrating a model voltage generation circuit using the external Vref during an initial calibration of the single-ended receiver, the model voltage generation circuit to set a model reference voltage;
   tracking an offset value for voltage-temperature (VT) drift in the model reference voltage using the model voltage generation circuit; and
   applying the offset value to the first voltage generation circuit to calibrate the first internal Vref during a periodic calibration of the single-ended receiver.

2. The method of claim 1, further comprising, during the periodic calibration of the single-ended receiver, applying the offset value to a second voltage generation circuit to calibrate a second internal Vref.

3. The method of claim 1, wherein the model voltage generation circuit is a model digital-to-analog converter (DAC) and the first voltage generation circuit is a first internal DAC, and wherein the tracking the offset and applying the offset comprises:
   determining a first difference between a first error code of the model DAC determined during initial calibration and a second error code of the model DAC determined during the periodic calibration; and
   applying the first difference to the first internal DAC to calibrate the first internal Vref during the periodic calibration.

4. The method of claim 3, wherein the tracking the offset and applying the offset further comprises:
   determining a second difference between the second error code determined during the periodic calibration and a third error code of the model DAC determined during a subsequent periodic calibration; and
   applying the second difference to the first internal DAC to calibrate the first internal Vref during the subsequent periodic calibration.

5. A method comprising:
   performing an initial calibration of a reference voltage (Vref) generated by a first voltage generation circuit in a single-ended receiver, wherein the performing comprises calibrating the Vref using an external Vref from an external Vref pin and data received from a single-ended transmitter on a channel;
   performing a periodic calibration of the Vref without using additional data on the channel, wherein the performing the periodic calibration comprises:
      calibrating a model voltage generation circuit using the external Vref; and
      applying an offset of the model voltage generation circuit to the single-ended receiver to calibrate the Vref generated by the first voltage generation circuit.

6. The method of claim 5, wherein the model voltage generation circuit is a model digital-to-analog converter (DAC) and the first voltage generation circuit is a first internal DAC, and wherein performing the periodic calibration comprises:
   determining a first difference between a first error code of the model DAC determined during the performing the initial calibration and a second error code of the model DAC determined during the performing the periodic calibration; and
   applying the first difference to the first internal DAC to calibrate the Vref during the periodic calibration.

7. The method of claim 5, wherein the single-ended receiver is a dynamic random access memory (DRAM) device and the single-ended transmitter is a memory controller.

8. The method of claim 5, wherein the single-ended receiver is a memory controller and the single-ended transmitter is a dynamic random access memory (DRAM) device.

9. A single-ended receiver comprising:
   a first voltage generation circuit to generate a first internal reference voltage (Vref);
   a first internal voltage generation circuit to set the first internal Vref;

an amplifier to receive the first internal reference voltage and a signal on a channel from a single-ended transmitter; and a reference voltage calibration controller comprising a model voltage generation circuit configurable to set a model reference voltage, wherein the reference voltage calibration controller is configurable to calibrate the model voltage generation circuit using an external Vref during an initial calibration of the single-ended receiver, track an offset value for voltage-temperature (VT) drift in the model reference voltage using the model voltage generation circuit, and apply the offset value to the first internal voltage generation circuit to calibrate the first internal Vref during a periodic calibration of the single-ended receiver.

10. The single-ended receiver of claim 9, further comprising:

a filter coupled to a pin to receive the signal received from a single-ended transmitter via a channel;

a multiplexer coupled to the filter and to the pin; and logic circuitry coupled to an output of the amplifier, the logic circuitry is configurable to calibrate the single-ended receiver in the initial calibration using the external Vref and a signal pattern received on the pin via the channel and to calibrate the single-ended receiver in the periodic calibration using the external Vref and the model voltage generation circuit, and wherein the signal pattern is not received on the pin during the periodic calibration.

11. The single-ended receiver of claim 9, wherein the single-ended receiver resides in a memory device.

12. The single-ended receiver of claim 9, wherein the single-ended receiver resides in a dynamic random access memory (DRAM) device.

13. The single-ended receiver of claim 9, wherein the single-ended receiver resides in a memory controller.

14. The single-ended receiver of claim 9, wherein the reference voltage calibration controller is configurable to apply the offset value to a second internal voltage generation circuit of a second single-ended receiver to calibrate a second internal Vref.

15. The single-ended receiver of claim 9, wherein the first voltage generation circuit is calibrated during the initial calibration using a clock pattern on a second pin via the channel.

16. The single-ended receiver of claim 15, wherein the first voltage generation circuit is calibrated by:

receiving the clock pattern on the second pin coupled to the channel;

filtering the clock pattern received on the second pin; and comparing the filtered clock pattern to the first internal Vref to set the first internal Vref.

17. The single-ended receiver of claim 9, wherein the reference voltage calibration controller is configurable to apply the offset value to a second voltage generation circuit to calibrate a second internal Vref.

18. The single-ended receiver of claim 17, wherein the reference voltage calibration controller is configurable to apply a first difference to a second internal digital-to-analog converter (DAC) of the second voltage generation circuit to calibrate the second internal Vref during the periodic calibration.

19. The single-ended receiver of claim 17, wherein the reference voltage calibration controller is configurable to track the offset and apply the offset by:

determining a second difference between a second error code of a model digital-to-analog converter (DAC) determined during the periodic calibration and a third error code of the model DAC determined during a subsequent periodic calibration; and applying the second difference to a second internal DAC of the second voltage generation circuit to calibrate the second internal Vref during the subsequent periodic calibration.

20. The single-ended receiver of claim 9, wherein the single-ended receiver is coupled to a pin to receive signals on the channel from another device comprising the single-ended transmitter.

* * * * *